United States Patent
Mo et al.

(10) Patent No.: US 7,720,187 B2
(45) Date of Patent: May 18, 2010

(54) METHODS AND APPARATUS FOR REDUCING DISCRETE POWER SPECTRAL DENSITY COMPONENTS OF SIGNALS TRANSMITTED IN WIDEBAND COMMUNICATIONS SYSTEMS

(75) Inventors: Shaomin Samuel Mo, Monmouth Junction, NJ (US); Alexander G. Gelman, Smallwood, NY (US)

(73) Assignee: Panasonic Corporation, Osaka (JP)

( * ) Notice: Subject to any disclaimer, the term of this patent is extended or adjusted under 35 U.S.C. 154(b) by 1257 days.

(21) Appl. No.: 10/547,835

(22) PCT Filed: Mar. 3, 2004

(86) PCT No.: PCT/US2004/006396

§ 371 (c)(1),
(2), (4) Date: Sep. 6, 2005

(87) PCT Pub. No.: WO2004/080020

PCT Pub. Date: Sep. 16, 2004

(65) Prior Publication Data

US 2006/0188001 A1    Aug. 24, 2006

Related U.S. Application Data

(60) Provisional application No. 60/451,466, filed on Mar. 3, 2003, provisional application No. 60/461,365, filed on Apr. 9, 2003.

(51) Int. Cl.
*H04L 7/00* (2006.01)

(52) U.S. Cl. .................. 375/365; 375/138; 375/150; 375/130; 375/259; 375/295; 375/316

(58) Field of Classification Search .................. 375/131, 375/130, 138, 150, 295, 316; 370/208, 412; 708/250, 251, 252, 253, 254; 714/715, 726
See application file for complete search history.

(56) References Cited

U.S. PATENT DOCUMENTS 4,755,987 A    7/1988   Lee et al.

(Continued)

FOREIGN PATENT DOCUMENTS

EP    1 202 165 A2    5/2002

(Continued)

OTHER PUBLICATIONS

TIA/EIA-95-B; Mobile Station-Base Station Compatibility Standard for Wideband Spread Spectrum Cellulr Systems, NSAI/TIA/EIA-95-B-1999, Mar. 1999, pp. 6-36, 6-37, 6-38, 6-39, 7-16 and 7-41.

*Primary Examiner*—Shuwang Liu
*Assistant Examiner*—Dhaval Patel
(74) *Attorney, Agent, or Firm*—RatnerPrestia

(57) ABSTRACT

Methods and apparatus for reducing discrete power spectral density (PSD) components of wideband signals transmitting blocks of data are disclosed. Discrete components are reduced by acquiring N symbols of pseudo-random data, each symbol having K bits; selecting one bit from each of the acquired symbols to generate N selected bits; selectively inverting a respective element in one of the data blocks responsive to the selected bits; acquiring one or more bits of pseudo-random data to replace a corresponding one or more respective bits of the acquired N symbols of pseudo-random data; and repeating for successive blocks of data.

25 Claims, 8 Drawing Sheets

U.S. PATENT DOCUMENTS

| | | | | |
|---|---|---|---|---|
| 5,852,630 A * | 12/1998 | Langberg et al. | ............ | 375/219 |
| 6,026,124 A | 2/2000 | Lee et al. | | |
| 6,188,767 B1 | 2/2001 | Needham et al. | | |
| 6,201,870 B1 * | 3/2001 | Medard et al. | ................ | 380/46 |
| 6,408,073 B1 * | 6/2002 | Hsu et al. | ................... | 380/241 |
| 6,714,614 B2 * | 3/2004 | Ozluturk | ..................... | 375/377 |
| 6,763,363 B1 * | 7/2004 | Driscoll | ..................... | 708/252 |
| 7,082,449 B2 * | 7/2006 | Rarick | ........................ | 708/250 |
| 7,103,109 B2 * | 9/2006 | Nakache et al. | ............ | 375/295 |
| 7,142,675 B2 * | 11/2006 | Cheng et al. | ................. | 380/46 |
| 7,308,575 B2 * | 12/2007 | Basil et al. | ................. | 713/168 |
| 2002/0140867 A1 * | 10/2002 | Weiss | ......................... | 348/723 |
| 2002/0172291 A1 | 11/2002 | Maggio et al. | | |
| 2002/0174152 A1 * | 11/2002 | Terasawa et al. | ............ | 708/250 |
| 2003/0048902 A1 * | 3/2003 | Wu | ............................. | 380/261 |
| 2003/0053555 A1 * | 3/2003 | McCorkle et al. | ........... | 375/295 |
| 2003/0072445 A1 * | 4/2003 | Kuhlman et al. | ............... | 380/42 |
| 2004/0019619 A1 * | 1/2004 | Buer et al. | .................. | 708/254 |

FOREIGN PATENT DOCUMENTS

WO        WO 85/00259        1/1985

* cited by examiner

METHODS AND APPARATUS FOR REDUCING DISCRETE POWER SPECTRAL DENSITY COMPONENTS OF SIGNALS TRANSMITTED IN WIDEBAND COMMUNICATIONS SYSTEMS

CROSS REFERENCE TO RELATED APPLICATIONS

This application claims the benefit of the filing date of provisional application No. 60/451,466 entitled "Method for Reducing Spectral Lines Generated by Sync Words in UWB Communication Systems Using a Single Random Sequence" filed Mar. 3, 2003, provisional application No. 60/461,365 entitled "Using Linear Feedback Shift Registers as Random Sequence Generators to Suppress Spectral Lines Generated by Pulses in UWB Communication Systems" filed Apr. 9, 2003, and provisional application No. 60/535,392 entitled "Ultra Wideband Scrambler for Reducing Power Spectral Density" filed Jan. 9, 2004, the contents of each being herein incorporated by reference.

FIELD OF THE INVENTION

The present invention relates to wideband communication systems and, more particularly, to methods and apparatus for reducing discrete power spectral density component of signals transmitted in wideband communication systems such as ultra wideband (UWB) communication systems.

BACKGROUND OF THE INVENTION

Ultra wideband (UWB) technology uses base-band pulses of very short duration to spread the energy of transmitted signals very thinly from near zero to several GHz. UWB technology is presently in use In military applications and techniques for generating UWB signals are well known. Commercial applications will soon become possible due to a recent decision announced by the Federal Communications Commission (FCC) that permits the marketing and operation of consumer products incorporating UWB technology.

The key motivation for the FCC's decision to allow commercial applications is that no new communication spectrum is required for UWB transmissions because, when they are properly configured, UWB signals can coexist with other application signals in the same spectrum with negligible mutual interference. The FCC has specified emission limits for UWB applications to prevent Interference with other communication systems.

The emission profile of a UWB signal can be determined by examining Its power spectral density (PSD). Characterization of the PSD of a "Time-Hopping Spread Spectrum" signaling scheme in the presence of random timing jitter using a stochastic approach is disclosed in an article by Moe et al. titled "On the Power Spectral Density of Digital Pulse Streams Generated by M-ary Cyclostationary Sequences In the Presence of Stationary Timing Jitter." See IEEE Tran. on Comm., Vol. 46, no. 9, pp. 1135-1145, September 1998. According to this article, the power spectra of UWB signals consists of continuous and discrete components. Discrete components create peaks in the PSD that may exceed the FCC emission limits even when the continuous components are well below these limits.

There is an ever present desire to increase the communication distances of communication systems. One way to Increase communication distance is to increase the power used for transmissions. To increase transmission power while still conforming to the FCC emission limits for UWB signals, it is desirable to reduce the discrete components so that overall power can be increased while still conforming to the FCC emission limits for UWB signals. In traditional communication systems, scramblers are commonly used to reduce discrete components (i.e., data whitening). These scramblers, however, are insufficient for reducing discrete PSD components In UWB communication systems, e.g., due to their high pulse repetition frequency (PRF), i.e., about 100 Mbps to 500 Mbps, and their time division multiple access (TDMA) frame structure. Accordingly, improved methods and apparatus for reducing discrete PSD components of UWB signals are needed. The present invention fulfills this need among others.

SUMMARY OF THE INVENTION

The present Invention is embodied in methods and apparatus for reducing discrete power spectral density (PSD) components of wideband signals transmitting blocks of data. Discrete components are reduced by acquiring N symbols of pseudo-random data, each symbol having K bits; selecting one bit from each of the acquired symbols to generate N selected bits; selectively inverting a respective element In one of the data blocks responsive to the selected bits; acquiring one or more bits of pseudo-random data to replace a corresponding one or more respective bits of the acquired N symbols of pseudo-random data; and repeating for successive blocks of data.

In addition, the present invention is embodied In methods and apparatus for receiving these selectively inverted wideband signal and In pseudo-random number generators.

BRIEF DESCRIPTION OF THE DRAWINGS

The Invention is best understood from the following detailed description when read in connection with the accompanying drawings, with like elements having the same reference numerals. Included in the drawings are the following figures.

DETAILED DESCRIPTION OF THE INVENTION

Figure 1:
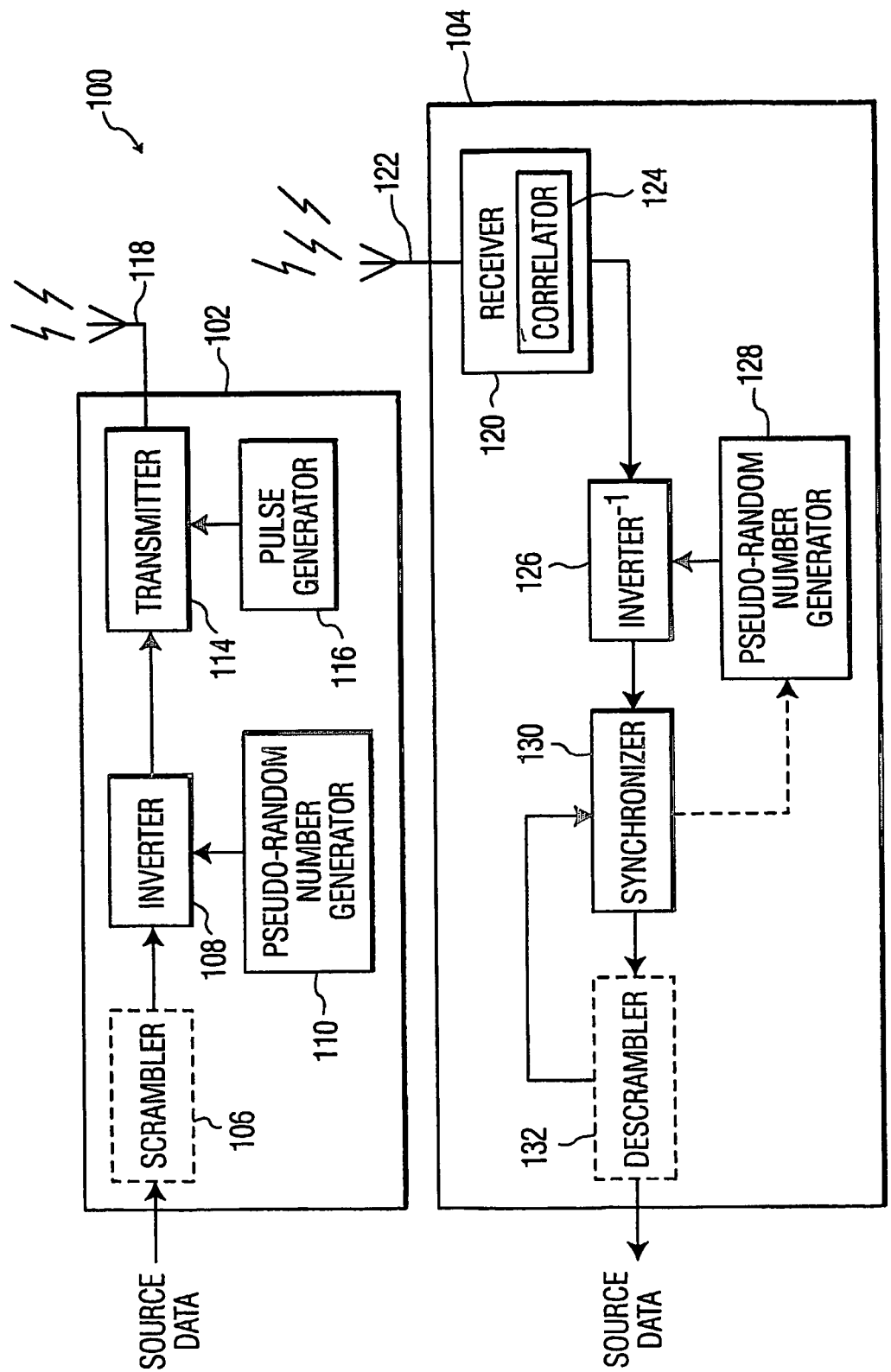
FIG. 1 is a block diagram of an exemplary communication system in accordance with the present invention.

FIG. 1 is a conceptual representation of an exemplary wideband communication system 100 in accordance with the present invention. Functions of one or more blocks within the illustrated communication system 100 can be performed by the same piece of hardware or module of software. It should be understood that embodiments of the present Invention may be implemented in hardware, software, or a combination thereof. In such embodiments, the various component and steps described below may be implemented in hardware and/or software.

In general overview, a transmitting apparatus 102 for transmitting source data Inverts and, optionally, scrambles the source data prior to transmission to reduce the discrete power spectral density (PSD) components of the transmitted source data. The transmitting apparatus 102 employs improved inverting techniques that offer improved randomization of the source data utilizing relatively short pseudo-random sequences, thereby reducing the discrete PSD components and facilitating synchronization. A receiving apparatus 104 receives the transmitted source data and reverses the inversion and optional scrambling to recover the original source data. The source data Includes blocks of data made up of elements. As used herein, the term elements may be used to represent frames of data within the blocks, data symbols within the frames, and/or bits within the data symbols. Each data symbol may include one or more bits.

The components of the transmitting apparatus 102 and the receiving apparatus 104 are now described in detail. In an exemplary embodiment, the source data is applied to an optional scrambler 106 that is configured to scramble the source data. The scrambler 106 scrambles elements within the blocks of source data according to a predetermined scrambling function. The scrambler 106 may scramble all of the source data or may scramble a portion of the source data such as just frames within the source data containing repetitive data, e.g., synchronization words. In an alternative exemplary embodiment, the source data is not scrambled and the optional scrambler 106 can be omitted.

In an exemplary embodiment, the scrambler 106 scrambles at least a portion of the source data using scrambling words. A table of eight exemplary scrambling words (numbered 0-7) are depicted In Table 1.

TABLE 1

| | |
|---|---|
| 0: | 0000 |
| 1: | 0001 |
| 2: | 0010 |
| 3: | 0011 |
| 4: | 0100 |
| 5: | 0101 |

TABLE 1-continued

| | |
|---|---|
| 6: | 0110 |
| 7: | 0111 |

The exemplary scrambling words may be logically combined with portions of the source data, e.g., using an XOR logic circuit (not shown), to scramble the source data, which is described in further detail below.

In an alternative exemplary embodiment, a scrambler such as those described in proposals to the Institute of Electrical and Electronic Engineer's (IEEE) standard IEEE 802.15.3a is employed to scramble the source data. The proposed scrambler uses a 15-bit linear feedback shift register (LFSR) to generate a pseudo-random binary sequence (PRBS) for the scrambler. At the beginning of each frame, the LFSR is loaded with predefined values (seeds), which are referred to herein as initial settings. Four seeds indexed with a two bit identifier $(b_1, b_0)$ are defined for selection as the initial setting, which is illustrated in Table 2.

TABLE 2

| Seed identifier $(b_1, b_0)$ | Seed value $(x_{14} \ldots x_0)$ |
|---|---|
| 0, 0 | 0011 1111 1111 111 |
| 0, 1 | 0111 1111 1111 111 |
| 1, 0 | 1011 1111 1111 111 |
| 1, 1 | 1111 1111 1111 111 |

The seed values used for scrambling may be selected from the seed set using the two bit identifier. The selected seed is then logically combined with the source data, e.g., using an XOR logic circuit (not shown), to scramble the source data. The two bit identifier may be transmitted in a packet along with the source data for use in the receiver 104 to initialize the descrambler 132.

As depicted in Table 2, the seed values are highly correlated (i.e., only the first two bits of each seed value are unique) and, thus, the pseudo random sequences generated are highly correlated, resulting in line spectra due to the lack of adequate randomness. The inventors have recognized that superior results in the suppression of discrete PSD components may be obtained through the use of uncorrelated seeds. Table 3 depicts an exemplary seed set for use with the scrambler 106.

TABLE 3

| Seed identifier $(b_1, b_0)$ | Seed value $(x_{27} \ldots x_0)$ |
|---|---|
| 0, 0 | 0100 1100 0000 0101 0001 0000 1110 |
| 0, 1 | 1011 1000 0101 1011 1001 1101 1010 |
| 1, 0 | 0101 1111 1101 0010 1000 0001 1001 |
| 1, 1 | 0000 1111 0010 1111 0011 0111 1111 |

In Table 3, there are four seed values and each seed value includes 28 bits. The seed values are substantially uncorrelated and, therefore, pseudo random sequences generated using these seed values are substantially uncorrelated. The seed set shown in Table 3 is for illustration only and seed sets with seeds having different seed values, more or less seeds, and more or less bits per seed may be employed. Those of skill in the art will understand how to generate suitable uncorrelated seed values for use in a seed set from the description herein.

An inverter 108 inverts elements within the blocks of the source data according to a predetermined inverting function.

In an exemplary embodiment, the inverter 108 is coupled to a pseudo-random number generator 110 that generates a number (N) of symbols having evenly distributed binary numbers where the evenly distributed binary numbers are periodically updated, e.g., prior to each frame of source data. The inverter 108 may be a multiplexer (not shown) that passes the source data or the inverse of the source data, e.g., as inverted by an inverter circuit (not shown), on an element by element basis responsive to the select bits. As described in further detail below, the inverter 108 is configured to receive one bit from each of the symbols of the pseudo-random number generator 110 to create select bits and to invert elements within the blocks of source data responsive to the select bits.

Figure 2:
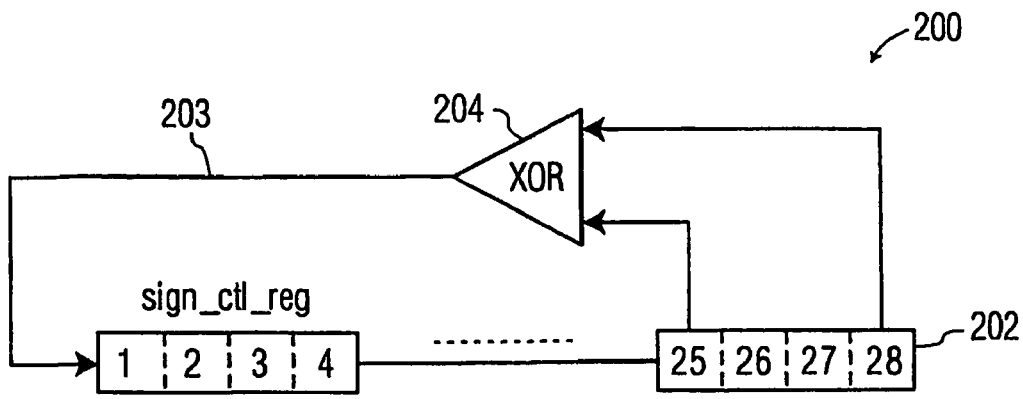
FIG. 2 is a block diagram of an exemplary pseudo-random number generator for use in the exemplary communication system of FIG. 1.

FIG. 2 depicts an exemplary pseudo-random number generator 200. The pseudo-random number generator 200 is a linear feedback shift register (LFSR) including a shift register 202 and a feedback loop 203. The feedback loop 203 includes a logic circuit 204 having input ports coupled to select intermediate bit registers (e.g., bit registers numbered 25 and 28) within the shift register 202, and an output port coupled to a first bit register within the shift register 202. The logic circuit 204 combines the values in the select intermediate bit registers to form a new value that is fed back into the shift register 202 to update the pseudo-random number generator. The illustrated series of bit registers includes 28 bit registers (cells) numbered 1, 2, 3, 4 . . . 25, 26, 27, 28. The illustrated logic circuit 204 is an exclusive OR gate (XOR) that combines the bit values of two individual bit registers (such as cells 25 and 28) and feeds the resultant value back into the shift register 202. In an alternative exemplary embodiment, the logic circuit 204 may be another type of logic circuit such as an exclusive not OR gate (NXOR).

In an exemplary embodiment, each register within the shift register 202 is examined after each shift. A condition where all of the bits in the shift register 202 have a value of "0" Is illegal when an XOR gate is in the feedback loop 203 because the pseudo-random number generator 200 is not able to leave this state. Similarly a value of all "1"s is illegal if an NXOR gate is in the feedback loop 203. If an illegal condition occurs, at least one bit within the shift register 202 is inverted.

Figure 9:
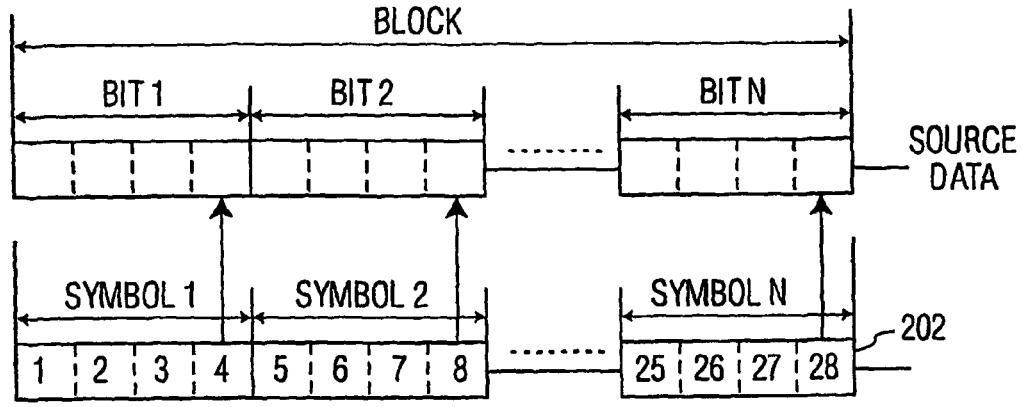
FIG. 9 is a block diagram illustrating the bit flow of the pseudo-random number generator and inverter of the communication system of FIG. 1 for inverting an individual bit based on a select bit in accordance with one aspect of the present invention.
Figure 10:
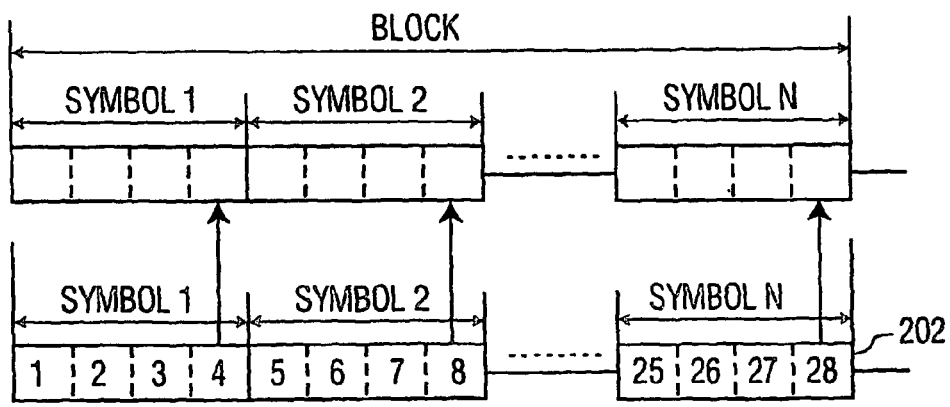
FIG. 10 is a block diagram illustrating the bit flow of the pseudo-random number generator and inverter of the communication system of FIG. 1 for inverting each bit of a symbol based on a select bit in accordance with another aspect of the present invention.
Figure 11:
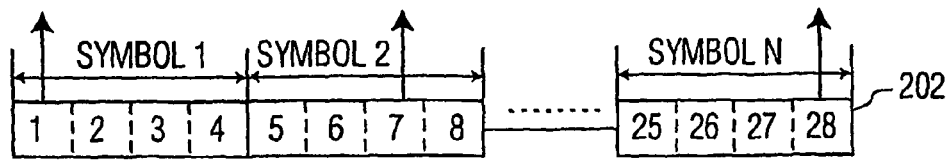
FIG. 11 is a block diagram illustrating random bit selection from each symbol of a pseudo-random number generator in accordance with another aspect of the present invention.

The Illustrated shift register 202 can be divided into a predefined number (N) of designated symbol areas. For example, if a symbol is defined as 4 bits, the shift register 202 is effectively divided into 7 designated symbol areas, i.e., bit registers 1-4, 5-8, 9-12, 13-16, 17-20, 21-24, and 25-28. One bit from each designated symbol area is coupled to the inverter, e.g., via another shift register (not shown), for use in inverting elements of the source data. For example, the inverter may invert a bit of the source data for each select bit from the N symbols generated by the pseudo-random number generator (see FIG. 9, with select bits indicated by an up arrow extending from the bits), each bit within a symbol for each select bit (see FIG. 10), or each bit within a frame for each select bit. The select bits may be in the same relative position in each symbol as shown in FIGS. 9 and 10 or in different (random) positions as shown In FIG. 11. The designated symbol areas may each include a uniform number of bit registers or different numbers of bit registers. Various alternative embodiments will be readily apparent to those of skill in the art.

Prior to generating pseudo-random numbers, the shift register 202 within the LFSR is initialized with bit values (e.g., a bit stream of evenly distributed ones "1" and zeroes "0"). The shift register 202 may be reinitialized with new bit values at predefined intervals such as after each symbol, frame (e.g., prior to each synchronization word), or block of data. Suitable methods for initializing the shift register 202 are described below.

Figure 2A:
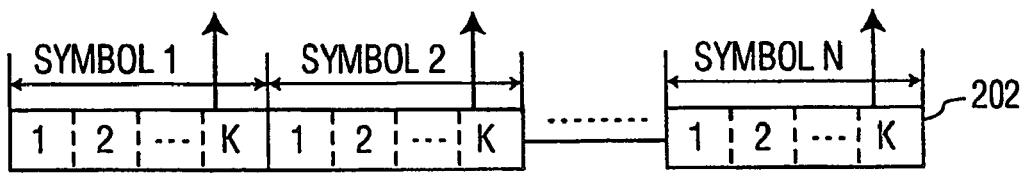
FIGS. 2A, 2B, and 2C are block diagrams illustrating bit processing within the pseudo-random number generator of FIG. 2.
Figure 2B:
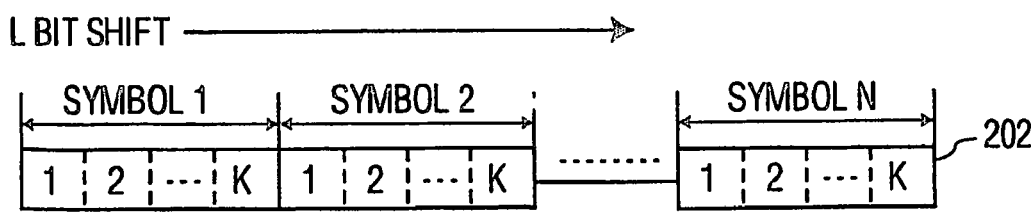
Figure 2C:
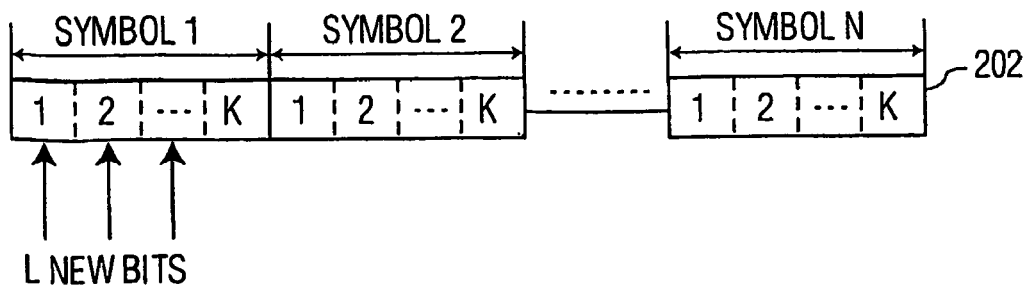

The operation on the shift register 202 within the pseudo-random number generator 200 for one update is shown in FIGS. 2A, 2B, and 2C. The shift register 202 includes a bit string (referred to herein as sign_ctl_array). First, individual elements in the source data are associated with one bit from a designated symbol area of the shift register 202, as shown in FIG. 2A. Next, the sign_ctl_array in the shift register is shifted to the right (i.e. toward less significant bit positions) by L bits (wherein L is one or more bits), as shown in FIG. 2B. As a last step, L new random bits (e.g., 3 random bits) are generated and inserted into the first L bits of the shift register 202, as shown in FIG. 2C.

Referring back to FIG. 1, in the illustrated embodiment, the inverter 108 is positioned after the scrambler 104 such that the inverter 108 inverts the source data after scrambling. In an alternative exemplary embodiments, the scrambler 106 may be positioned after the inverter 108 with the inverter 108 inverting portions of the source data prior to scrambling by the scrambler 106.

The transmitter 114 is coupled to a pulse generator 116 that generates a wideband pulse signal made up of a series of signal pulses such as ultra wideband (UWB) signal pulses. The transmitter 114 modulates the source data in digital format onto the wideband pulse signal for transmission via an antenna 108. The transmitter 114 may be a pulse modulator as shown or it may be a digital-to-analog converter (not shown) with a pulse shaping circuit (not shown), and may even be considered part of the antenna 118.

Figure 1A:
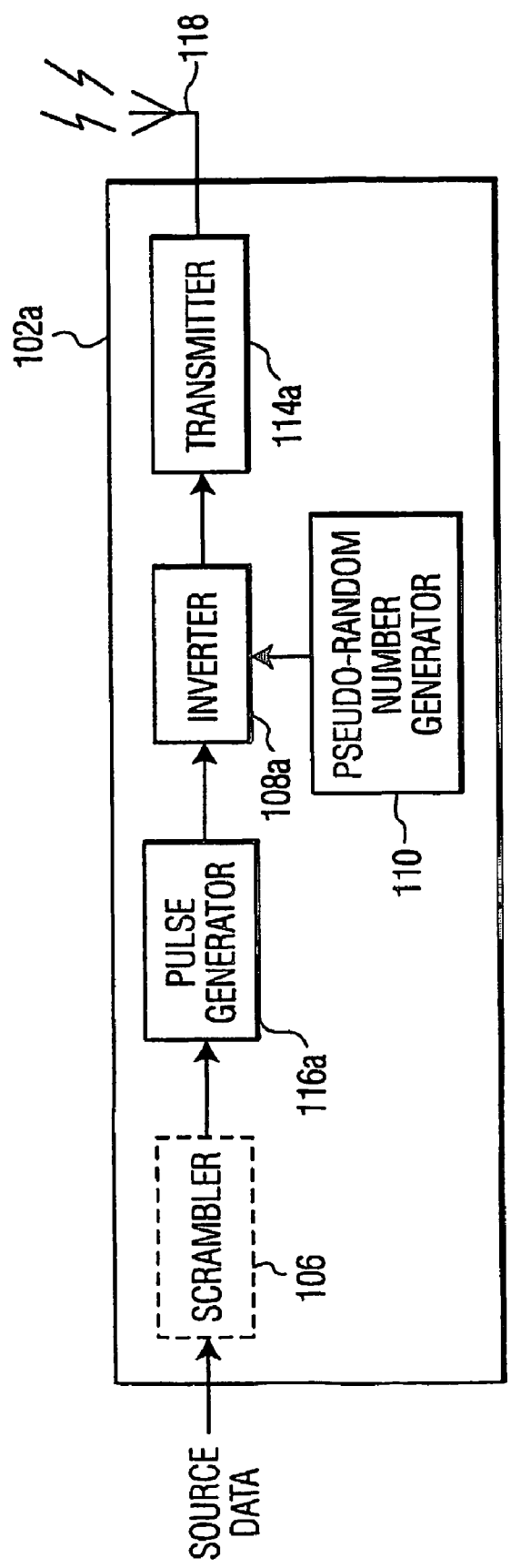
FIG. 1A is a block diagram of an alternative transmitting apparatus of use in the exemplary communication system of FIG. 1.

FIG. 1A depicts an alternative exemplary transmitting apparatus 102a. The transmitting apparatus 102a is similar to the transmitting apparatus 102 of FIG. 1 with the exception that the pulse generator 116 (FIG. 1) is replaced with a pulse generator 116a (FIG. 1A) positioned between the scrambler 106 and an inverter 108a. In this embodiment, the pulse generator 116a modulates optionally scrambled digital source data onto wideband signal pulses to create an analog signal. The inverter 108a then inverts the source data in the analog domain for transmission by the transmitter 114a. The transmitter 114a may be pulse shaping circuitry, a connector simply coupling the Inverter 108a to the antenna 118, or may even be considered part of the antenna 118. A suitable inverter 108a for inverting the source data in the analog domain will be understood by those of skill in the art from the description herein. Further, various alternative exemplary embodiments for a transmitting apparatus In accordance with the present invention will be understood by those of skill in the art from the description of the transmitting apparatus 102 and 102a of FIGS. 1 and 1A, respectively.

Referring back to FIG. 1, a receiver 120 within the receiving apparatus 104 receives the inverted and, optionally, scrambled wideband pulse signal through another antenna 122. A correlator 124 within the receiver 120 correlates the received data to the pulse shape used by the transmitting apparatus 102 to identify pulses and convert them to digital pulses. In an exemplary embodiment, the correlator 124 is a matched filter correlator configured to identify and correlate incoming wideband pulses such as UWB pulses.

An inverter$^{-1}$ 126 reverses the inversion introduced to the source data by the inverter 108 according to a predefined inverting function that is based on the inverting function of the inverter 108. In an exemplary embodiment, the inverter$^{-1}$ 126 is coupled to a pseudo-random number generator 128 that is substantially identical to the pseudo-random number generator 110 described in detail above (and, thus, Is not described in further detail here). The inverter$^{-1}$ 126 may be a multiplexer (not shown) which passes the source data or the inverse of the source data, e.g., as inverted by an inverter logic circuit (not shown), responsive to select bits generated by the pseudo-random number generator 128.

The two pseudo-random number generators 110 and 128 generate identical bit-strings. In an exemplary embodiment, for synchronization, the generators 110 and 128 are configured to start at a common point when the first bit of a sequence is transmitted or received. In an alternative exemplary embodiment, Instead of generating a set of random numbers at each frame, a set of random numbers can be generated in advance and stored into an array. The same array is kept in the pseudo-random number generators 110, 128 in both the transmitting apparatus 102 and the receiving apparatus 104. A random number is generated as an index to the stored array and is transmitted for use in establishing synchronization between the transmitting apparatus 102 and the receiving apparatus 104.

A synchronizer 130 synchronizes the received data for descrambling by an optional descrambler 132. In an exemplary embodiment, the descrambler 132, after synchronization, reverses the scrambling introduced by the scrambler 106 to yield the original source data. The descrambler 132 reverses the scrambling according to a predefined descrambling function that is based on the scrambling function used by the scrambler 106. In the illustrated embodiment, the synchronizer 130 receives feedback from the descrambler 132 in synchronizing the scrambled source data. Further details regarding the synchronization of the scrambled source data are described below. In an alternative exemplary embodiment, where the scrambler 106 is omitted, the descrambler 132 may be omitted.

Figure 3:
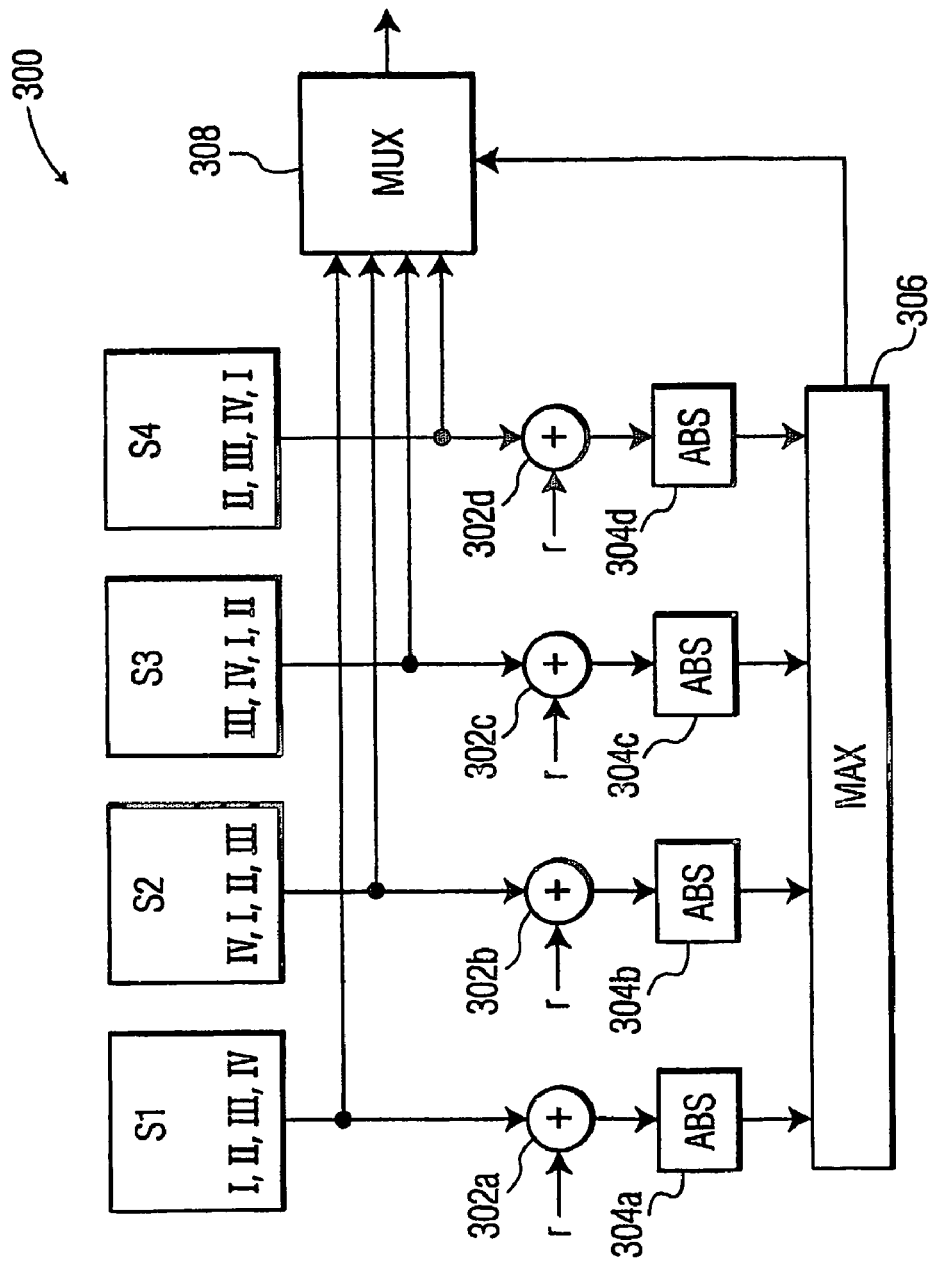
FIG. 3 is a block diagram of an exemplary synchronizer for use in the communication system of FIG. 1.

FIG. 3 depicts a synchronizer 300 in accordance with an exemplary embodiment of the present invention for use as the synchronizer 130 in FIG. 1. The Illustrated synchronizer 300 is a four pattern synchronizer that is based on four seeds I-IV, which were used to scramble the source data. The first pattern S1 includes the four seeds in sequential order from I-IV. The second pattern 52 includes the four seeds starting with IV followed by I, II, and III. The third pattern S3 is III, IV, I, II and the fourth pattern S4 is II, III, IV, I. The received sequence, r, is exclusively ORed, XOR, with each of the four patterns S1-S4 using XOR logic circuits 302a-d. Absolute value components (ABS) 304a-d find the absolute value of the resultant values produced by the XOR logic circuits 302a-d. A maximum value circuit 306 then determines which patterns S1-S4 produces the maximum absolute value when combined with the received sequence, r, and controls a multiplexer 308 such that the determined pattern is passed by the multiplexer 308 for use in descrambling the received sequence. In embodiments where the sync word is all one value, e.g., all ones (1's), and the inverter 108 (FIG. 1) Inverts the entire sync word on a random basis, the use of absolute value components 304a-d in the synchronizer 300 enables the detection of a valid sync word in the receive data prior to inversion by the inverter$^{-1}$ 126 (FIG. 1), e.g., during an Initial system channel access. The detected sync word may then serve as the basis for initializing the pseudo-random number generator 128 (FIG. 1).

In an alternative exemplary embodiment, where the scrambler 106 scrambles the source data using a LFSR initialized using seeds selected from an indexed seed set, the synchronizer 130 (FIG. 1) may use an index value received In the transmitted data to synchronize the descrambler 132. In accordance with this embodiment, the descrambler 132 may include an LFSR (not shown) and a seed set that correspond to the LFSR and seed set, respectively, in the scrambler 106. The synchronizer 130 identifies the index value received in the transmitted data and passes it to the descrambler 132, which selects the appropriate seed to initialize the descrambler 132.

Referring back to FIG. 1, in the illustrated embodiment, the descrambler 132 is positioned after the inverter$^{-1}$ 126 such that the source data is inverted and then descrambled. In an alternative embodiment, the inverter$^{-1}$ 126 may be positioned after the descrambler 132 with the inversion and descrambling performed in the opposite order.

Figure 4:
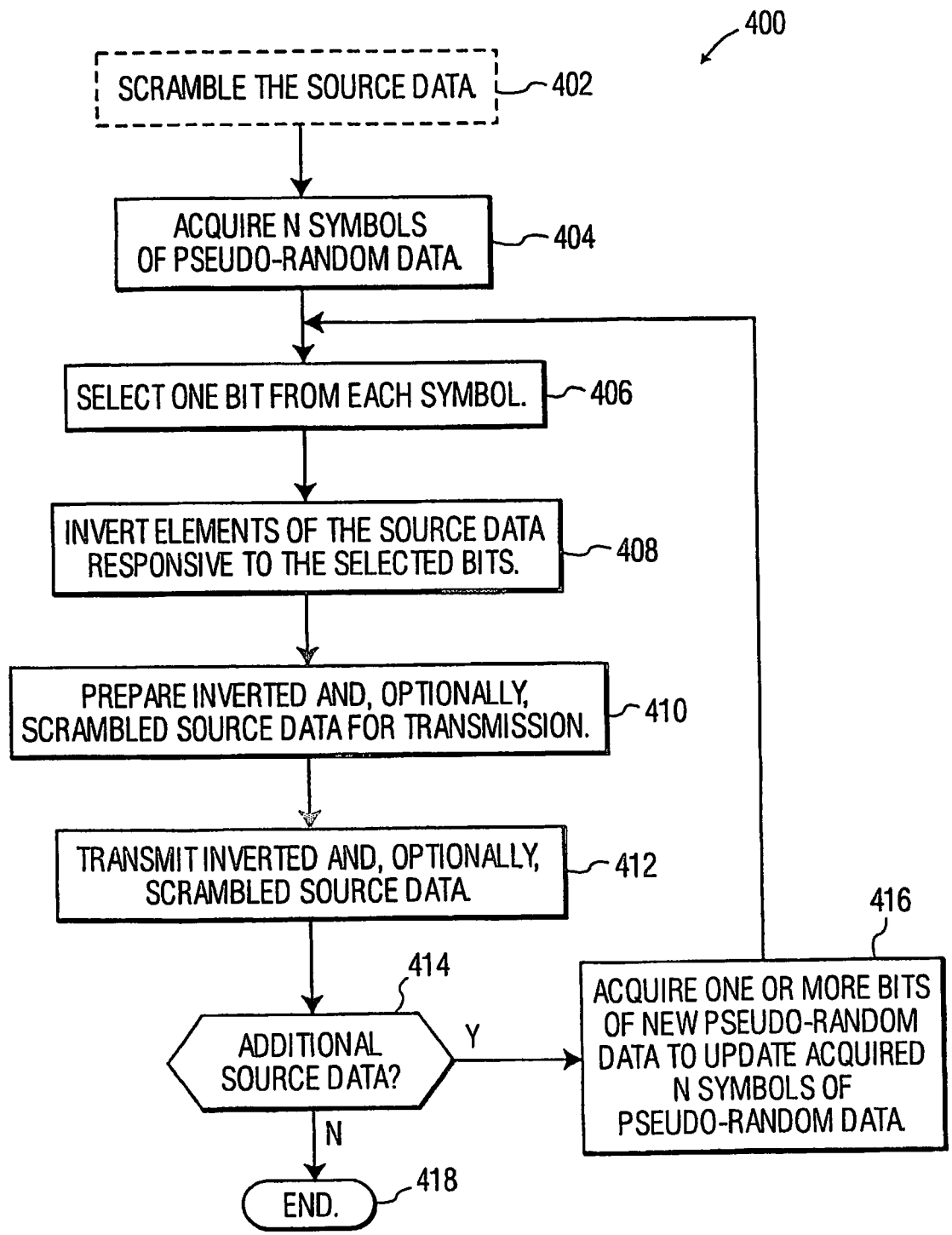
FIG. 4 is a flow chart of exemplary transmitting steps in accordance with the present Invention.

FIG. 4 depicts a flow chart 400 of exemplary transmitting steps for reducing discrete PSD components in a wideband communication system such as a UWB communication system. The steps of flow chart 400 are described with reference to the components of FIGS. 1 and 2.

At block 402, the optional scrambler 106 scrambles the source data. The source data may include frames of data including payload data and non-payload data, e.g., synchronization data. In an exemplary embodiment, the source data is scrambled according to a predetermined scrambling function, e.g., using scrambling words, which are described in further detail below. The synchronization data may be all one symbol such as all positive (+) 1's. In an alternative exemplary embodiment, the source data is not scrambled and block 402 can be omitted.

At block 404, the shift register 202 initially acquires N symbols of pseudo-random data (i.e., bit string sign_ctl_array) during an initialization. The N symbols of pseudo-random data received during initialization may be supplied from a register or from a pseudo-random number generator, which is described in further detail below.

At block 406, the inverter 108 selects one bit from each of the acquired symbols of pseudo-random data to generate N select bits. The select bits may be selected by transferring select bits from cells within designated symbol areas of the shift register 202 into a register (not shown) associated with the inverter 108.

At block 408, the inverter 108 inverts respective elements in one of the data blocks responsive to the selected bits. In an exemplary embodiment, the inverter 108 inverts individual bits, each bit within a symbol, or each bit within a frame responsive to each bit of the selected bits. For example, if there are 7 select bits and the inverter 108 inverts each bit within a symbol responsive to each bit, the first select bit will determine whether each bit within a first symbol is inverted or not, the second select bit will determine whether each bit within a second symbol is inverted or not, etc. Likewise, if the inverter 108 inverts each bit within a frame, the first bit will determine whether each bit within a first frame is inverted or not, the second bit will determine whether each bit within a second frame is inverted or not, etc.

In the illustrated flow chart 400, source data is first scrambled (block 402) and then inverted (block 408). It will be understood by those of skill in the art that in other embodiments the source data may first be inverted and then scrambled, in which case the step of block 402 occur after the steps of blocks 404 through 412.

At block 410, the inverted and, optionally, scrambled source data is prepared for transmission. The source data may be prepared for transmission by using it to modulate pulses provided by a pulse generator, such as pulse generator 116. At block 412, the transmitter 114 transmits the inverted and, optionally, scrambled source data from the antenna 118.

At block 414, a decision to repeat blocks 406-412 is made responsive to the presence of additional source data for transmission. If additional source data is present for transmission, processing proceeds to block 416 to acquire additional pseudo-random data and the steps in blocks 406 through 412 are repeated. If all source data for transmission has been selectively inverted, processing ends at block 418.

At block 416, the shift register 202 acquires one or more bits of pseudo-random data to replace a corresponding one or more respective bits of the acquired symbols of pseudo-random data. In an exemplary embodiment, the shift register 202 shifts out one or more bits (such as a single data bit, a symbol of data bits, or one data bit for each select bit) after each frame or block of source data has been inverted. A corresponding number of data bits are concurrently shifted into the shift register 202 to replace the shifted out bits. The new pseudo-random data may be supplied by the logic circuit 204 to the shift register 202 responsive to one or more bit values in intermediate registers within the shift register 202.

Figure 5:
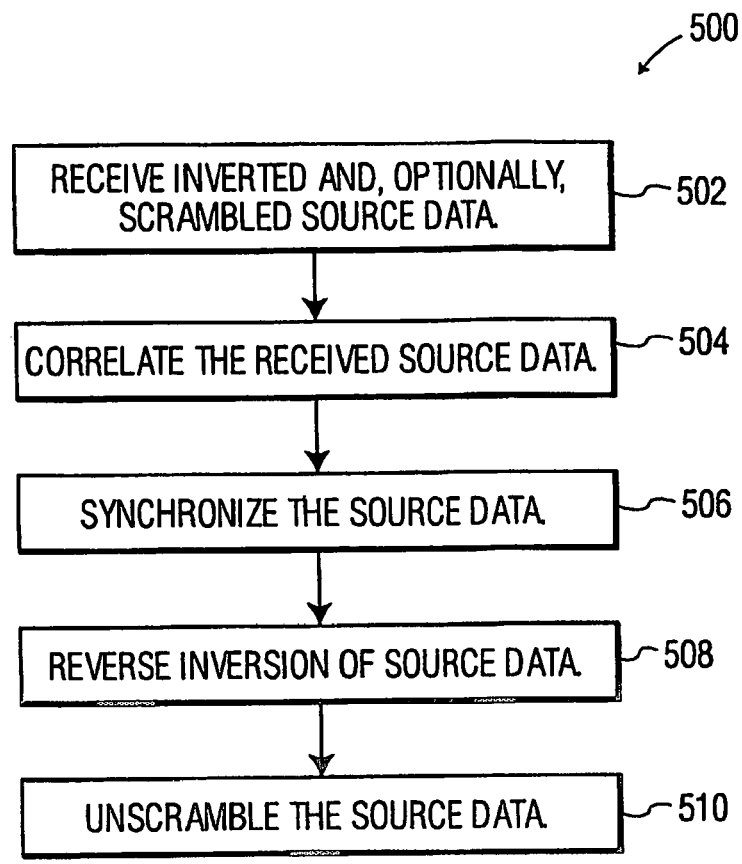
FIG. 5 is a flow chart of exemplary receiving steps in accordance with the present invention.

FIG. 5 depicts a flow chart 500 of exemplary receiving steps for receiving wideband signals that are inverted and, optionally, scrambled in accordance with the present invention. The steps of flow chart 500 are described with reference to the components of FIGS. 1, 2, and 3.

At block 502, the receiver 120 within the receiving apparatus 104 receives the inverted and, optionally, scrambled source data through the antenna 122 and, at block 504, the correlator 124 within the receiver 120 correlates the source data to identify the wideband pulse signal carrying the source data. At block 506, the synchronizer 130 synchronizes the received scrambled source data for reversal of the scrambling applied by the scrambler 106. In an exemplary embodiment, the synchronizer 130 synchronizes the scrambled and inverted source data based on feedback from the descrambler 132.

At block 508, the inverter$^{-1}$ 126 reverses the inversion introduced by the inverter 108 responsive to a pseudo-random number sequence or stream generated by the pseudo-random number generator 128. In an exemplary embodiment, the pseudo-random number generator 128 is configured to start when a designated bit is received, e.g., a first bit of a received sequence. At block 510, the descrambler 132 reverses the scramble introduced by the scrambler 106 to derive the original source data. In embodiments where the source data is not scrambled the step in block 510 is omitted.

In the illustrated flow chart 500, source data is first inverted (block 508) by the inverter$^{-1}$ 126 and then descrambled (block 510) by the descrambler 132. It will be understood by those of skill in the art that in alternative exemplary embodiments, the source data may first be descrambled and then inverted, in which case the step of block 508 occurs after the step of block 510.

Figure 6:
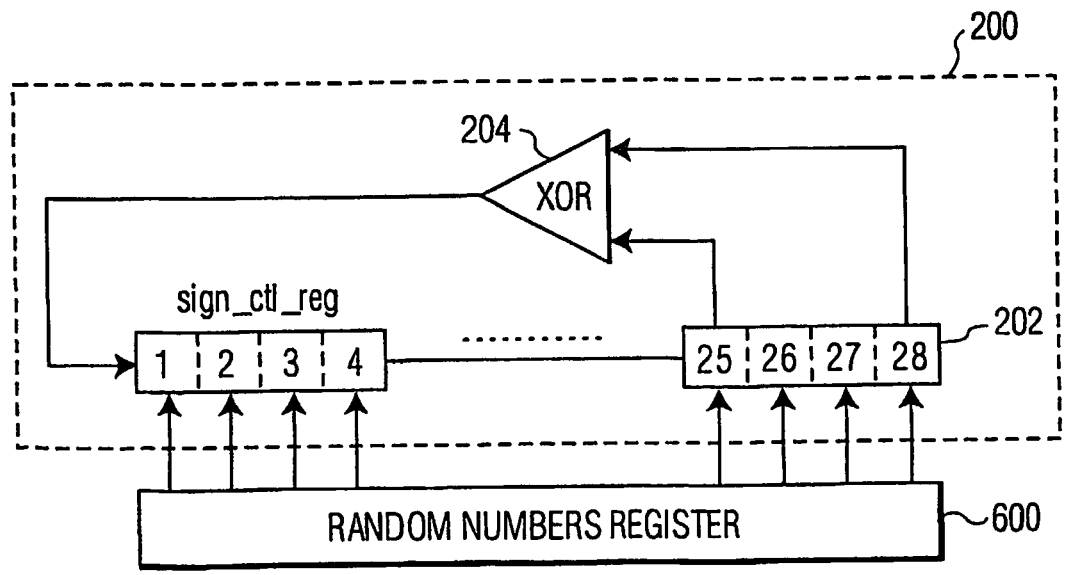
FIG. 6 is a block diagram of an exemplary embodiment of a pseudo-random number generator with an initialization scheme in accordance with the present invention.

Initialization schemes for the exemplary pseudo-random number generator 200 of FIG. 2 are now described. FIG. 6 depicts the pseudo-random number generator 200 described above with reference to FIG. 2 and a random numbers register 600 for supplying random numbers to the shift register 202 of the pseudo-random number generator 200 for initialization. The register 600 stores one or more sequences of pseudo-random numbers of use in initializing the pseudo-random number generator 200. In an exemplary embodiment, the sequences of pseudo-random numbers are uncorrelated with respect to one another and each pseudo-random number includes one bit value for each cell of the shift register 202 within the pseudo-random number generator 200. For example, if a 28 bit shift register 202 is employed, each seed value has 28 bits.

Figure 7:
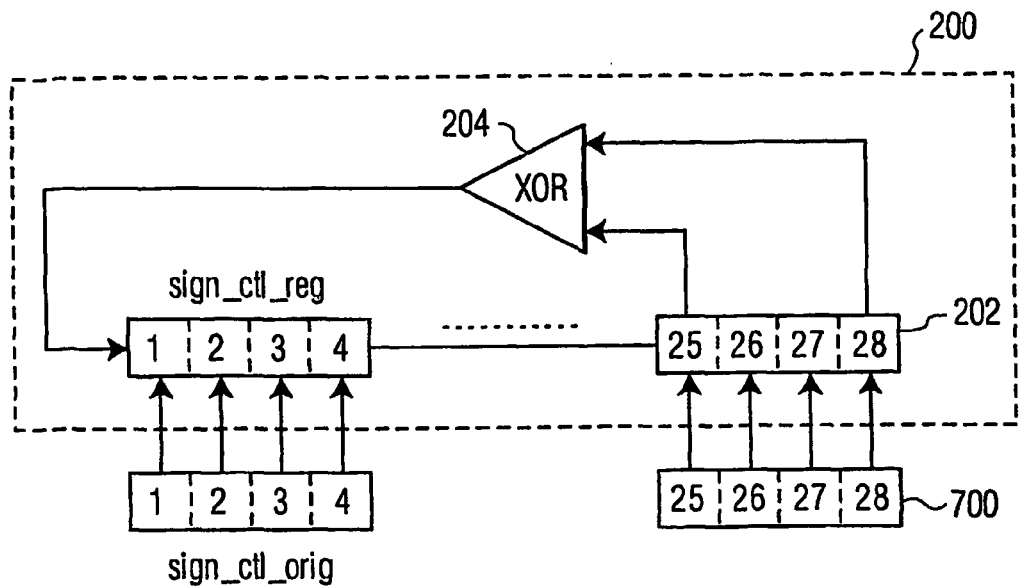
FIG. 7 is a block diagram of an exemplary embodiment of a pseudo-random number generator with an alternative Initialization scheme in accordance with the present invention.

FIG. 7 depicts the pseudo-random number generator 200 described above with reference to FIG. 2 and a second pseudo-random number generator 700 such as a second LFSR (with the feedback loop and logic circuitry of the LFSR omitted to simplify illustration and facilitate discussion). The bit registers of the second pseudo-random number generator 700 is coupled to bit registers of the shift register 202 within the pseudo-random number generator 200 to provide random bits for Initialization. In an exemplary embodiment, the second pseudo-random number generator 700 and the pseudo-random number generator 200 may operate in a similar manner, but may use different bits or a different logic circuit in the feedback loop. In an alternative exemplary embodiment, the second pseudo-random number generator 700 may be a random or pseudo-random number generator that is different than the pseudo-random number generator 200.

In an exemplary embodiment, at the beginning of each frame, a bit string sign_ctl_orig generated in the second pseudo-random number generator 700 is loaded as an initial setting for bit string sign_ctl_array in the first pseudo-random number generator 200. The bit string sign_ctl_array is updated for every bit that is transmitted and the bit string sign_ctl_orig is updated every frame. This operation is described by the following sequence of four steps:
1. At the beginning of each frame, right shift bit string sign_ctl_orig for n bits;
2. Copy sign_ctl_orig to sign_ctl_array;
3. Use sign_ctl_array to generate the sign control bits;
4. Go to step 1 for next frame.

It can be seen that the original state of bit string sign_ctl_array at frame n+1 is an n-bit delay of bit string sign_ctl_array at frame n.

It is noted from the above operation that, because bit string sign_ctl_orig specifies the initial state of bit string sign_ctl_array at the beginning of each frame, only bit string sign_ctl_orig needs to be synchronized in order to synchronize a receiving apparatus 104 to its transmitting apparatus 102.

Figure 8:
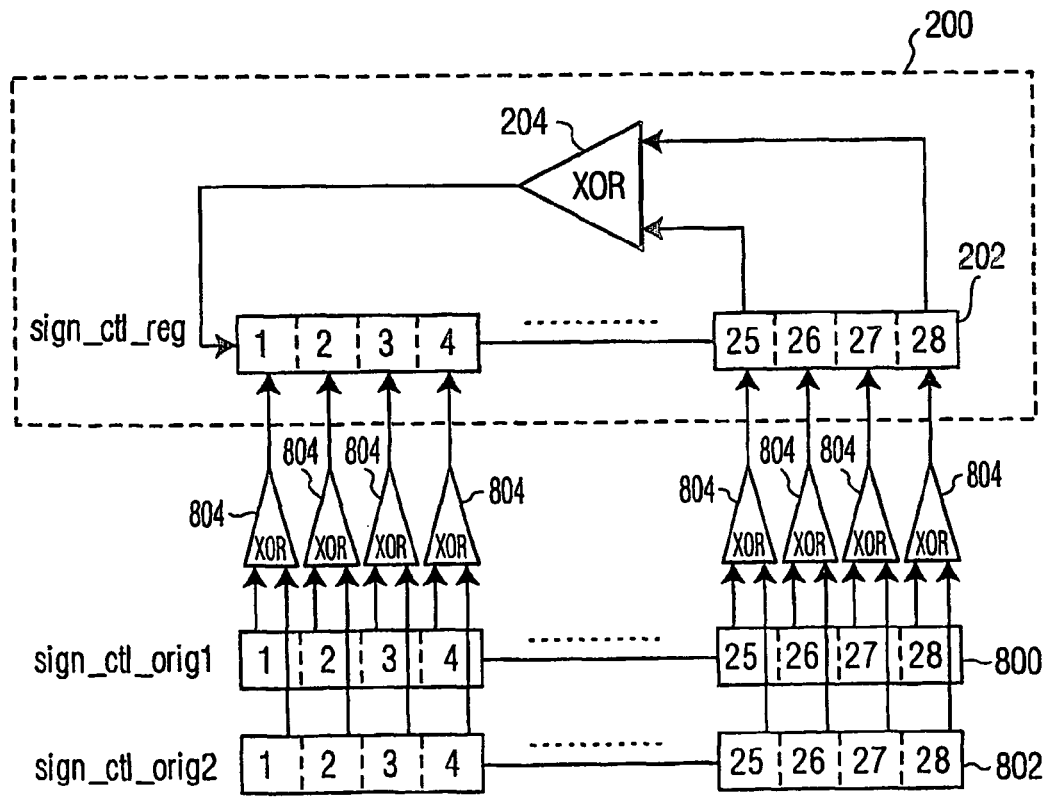
FIG. 8 is a block diagram of an exemplary embodiment of a pseudo-random number generator with another alternative initialization scheme In accordance with the present Invention.

FIG. 8 depicts another exemplary architecture for initializing the pseudo-random number generator 200 that exhibits increased randomness. This architecture employs a second pseudo-random number generator 800, a third pseudo-random number generator 802, and logic circuits 804. The second and third pseudo-random number generators may be LFSRs (with the feedback loop and logic circuitry of the LFSR omitted to simplify illustration and facilitate discussion) and the logic circuits may be XOR or XNOR gates. The logic circuits 404 combine respective bits of the second and third pseudo-random number generators 800 and 802 to generate the initializing values for the first pseudo-random number generator 200.

In an exemplary embodiment, at the beginning of each frame, bit strings sign_ctl_orig1 and sign_ctl_orig2 generated, respectively, by the second and third pseudo-random number generators 800 and 802 are combined to form an initial setting of the bit string sign_ctl_array of the first pseudo-random number generator 200. This operation is described by the following sequence of 5 steps.
1. At the beginning of each frame, right shift sign_ctl_orig1 n1 bits and sign_ctl_orig2 n2 bits;
2. Form, in the XOR gates 804, the exclusive OR of the respective bits of sign_ctl_orig1 and sign_ctl_orig2 to form an input value, sign_ctl_orig, i.e., sign_ctl_orig=sign_ctl_orig1 $\oplus$ sign_ctl_orig2;
3. Copy sign_ctl_orig to sign_ctl_array;
4. Use sign_ctl_array to generate select bits for inversion;
5. Go to step 1 for next frame.

Synchronization of the pseudo-random number generator 202 with the above initialization schemes is now described. In an exemplary embodiment, there are two synchronization phases. The two synchronization phases include an initial system channel access phase and an Initial traffic channel access phase. During the Initial system channel access phase, the receiving apparatus 102 has no knowledge of the states of the pseudo-random number generator 200 in the transmitting apparatus 102. Thereafter, during the initial traffic channel access phase, the receiving apparatus 102 has some knowledge of the states of the pseudo-random number generator 200 in the transmitting apparatus 102, thereby allowing a sequence number to be used for synchronization.

For initial channel system access, different methods can be used for the different pseudo-random number generator with Initialization described above with reference to FIGS. 6-9.

Initial channel access for the method described with reference to FIG. 6 is obtained using a set of random numbers that are generated in advance and stored in an array. Identical arrays are stored in the pseudo-random number generators 110, 128 in both the transmitting apparatus 102 and the receiving apparatus 104. A random number is generated as an index to the stored array and is transmitted for use in establishing synchronization between the transmitting apparatus 102 and the receiving apparatus 104.

Initial channel access for the method described with reference to FIG. 7 is obtained by sending the states of the bit registers of the second pseudo-random number generator 700 from the transmitting apparatus 102 to the receiving apparatus 104. For registers with length of n, n bits of data are sent. If, however, fewer bits are reserved for register states to be transmitted (e.g., only 4 bits of data), the status of only registers 1-4 only may be sent with the data. In this example, after 7 frames (i.e., 28 bits), the entire bit string sign_ctl_array 100 can be obtained. After initial synchronization, data in this field may be used to check whether bit string sign_ctl_orig remains synchronized between respective transmitting apparatus 102 and receiving apparatus 104.

Initial channel access for the method described with reference to FIG. 8 is similar to that for the method of FIG. 7 except that twice as much data is sent because bits from two registers of two pseudo-random number generators 800 and 802 are transmitted (assuming each pseudo-random number generator 800 and 802 has a shift register with the same number of bits as the shift register of the pseudo-random number generator 700).

Additional implementation details are now provided for the exemplary communication system 100 described above with reference to FIGS. 1, 2, 3, 4, and 5. In an exemplary embodiment, a scrambler array, SA, including M distinct symbols, each symbol consisting of n pulses is defined. The symbols may be, for example, binary representations of the numbers 0 to M−1. The complete procedure for a symbol-based operation is now described.

1. Set the initial value of m ($1 \leq m \leq M$) and set the initial value of sign_tx_array.
2. Set m=m+1 modulo (mod) M.
3. Use the m as an Index to the scrambler array SA to obtain one symbol;
4. Go to 2 until N symbols have been obtained. These N symbols are used to construct a new scramble word SW shown in equation 1:

$$SW=[SA(m), SA(m+1 \bmod M), SA(m+2 \bmod M), \ldots, SA(m+(N-1) \bmod M)] \quad (1)$$

5. Apply XOR operation on symbols of the source data for transmission and the generated SW to form a new block of data SSW1 as shown in equation 2:

$$SSW1(n)=symbol(n) \oplus SW(n)\ n=1, \ldots, N \quad (2)$$

6. Obtain N evenly distributed binary numbers $c_n \subset (1, -1)$ from the sign_tx_array and use these numbers to generate a new block of data SSW2, as shown in equation (3):

$$SSW2(n)=SSW1(n) \oplus sign\_tx\_array(n*K)\ n=1, \ldots, N \quad (3)$$

7. Use SSW2 for transmission.
8. Update sign_tx_array.
9. Go to 2 for the next frame.

The starting index of the next symbols in SW may be calculated as shown In equation 4:

$$m=m+N \bmod M \quad (4)$$

At the receiver, the following operation is performed on the received sequence SSW2 to synchronize the receiver to the transmitter and to recover the original symbols in the symbol based operation:

1. If this is the initial acquisition, initial value of m and random sequence generator are synchronized so that sign_tx_array(n)=sign rx_array(n).
2. Obtain N evenly distributed binary number from sign_rx_array and use these numbers to produce data SSW1 as shown in equation 5:

$$SSW1(n)=SSW2(n) \oplus sign\_rx\_array(n*K)\ n=1, \ldots, N \quad (5)$$

3. Form SW and use it to de-scramble SSW1 to get original data Symbôl(n) as shown in equations 6 and 7;

$$SW=[SA(m), SA(m+1 \bmod M), SA(m+2 \bmod M), \ldots, SA(m+(N-1) \bmod M)] \quad (6)$$

$$\text{Symbôl}(n)=SSW1(n) \oplus SW(n) \quad (7)$$

4. Calculate the index of m for the next word, m=m+N mod M;
5. Update sign_rx_array;
6. Go to step 2 for the next frame.

If sign_tx_array and sign_rx_array are synchronized, then equations 8, 9, and 10 are valid.

$$\text{sign\_tx\_array}(n) = \text{sign\_rx\_array}(n) \quad (8)$$

$$\begin{aligned}
S\hat{S}W1(n) &= SSW1(n) \oplus \text{sign\_tx\_array}(n) \oplus \text{sign\_rx\_array}(n) \\
&= SSW1(n) \oplus (\text{sign\_tx\_array}(n) \oplus \text{sign\_rx\_array}(n)) \\
&= SSW1(n)
\end{aligned} \quad (9)$$

$$\begin{aligned}
\text{Symbôl}(n) &= S\hat{S}W(n) \oplus SW(n) \\
&= SSW1(n) \oplus SW(n) \\
&= \text{Symbol}(n) \oplus SW(n) \oplus SW(n) \\
&= \text{Symbol}(n)
\end{aligned} \quad (10)$$

Although the components of the present invention have been described in terms of specific components, it is contemplated that one or more of the components may be implemented in software running on a computer. In this embodiment, one or more of the functions of the various components may be implemented in software that controls the computer. This software may be embodied in a computer readable carrier, for example, a magnetic or optical disk, a memory-card or an audio frequency, radio-frequency or optical carrier wave.

Further, although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for reducing discrete power spectral density (PSD) components of wideband signals transmitting blocks of data, each block including N elements, the method comprising the steps of: (a) acquiring N symbols of pseudo-random data, each symbol having K bits, by generating pseudo-random data, and shifting the generated pseudo-random data into a shift register, wherein the shift register includes N designated symbol areas; (b) selecting one bit from a fixed position within each designated symbol area of the shift register to generate N selected bits; (c) selectively inverting a respective element in one of the data blocks responsive to the selected bits; (d) acquiring one or more bits of pseudo-random data to replace a corresponding one or more respective bits of the acquired N symbols of pseudo-random data, by generating the one or more bits of pseudo-random data, and shifting the generated one or more bits into the shift register to replace a corresponding number of bits of the acquired N symbols of pseudo-random data that are concurrently shifted out of the shift register; and (e) repeating steps (b) through (d) with successive ones of the data blocks.

2. The method of claim 1, wherein the respective element is a bit and the selectively inverting step comprises the step of: selectively inverting bits in one of the data blocks responsive to the selected bits.

3. The method of claim 1, wherein the respective element is a symbol and the selectively inverting step comprises the step of: selectively inverting symbols in one of the data blocks responsive to the selected bits.

4. The method of claim 1, wherein the respective element is a frame and the selectively inverting step comprises the step of: selectively inverting frames in one of the data blocks responsive to the selected bits.

5. The method of claim 1, wherein the step of selecting a bit from a fixed position comprises the step of: selecting a first bit from a first fixed position in a first designated symbol area and a second bit from a second fixed position in a second designated symbol area, wherein the first and second fixed positions are in different positions relative to the respective designated symbol areas.

6. The method of claim 1, further comprising the step of: scrambling one or more elements within each block of data prior to the selectively inverting step.

7. The method of claim 6, wherein the scrambling step comprises the step of: selecting a pseudo-random number sequence from a pseudo-random number sequence set including a plurality of pseudo-random sequences to scramble one or more elements within each block of data.

8. The method of claim 7, wherein the plurality of pseudo-random sequences are substantially uncorrelated.

9. The method of claim 1, wherein the step of acquiring N symbols of pseudo-random data further comprises the step of generating pseudo-random data using at least one linear feedback shift register and wherein the method further comprises the step of: initializing the at least one linear feedback shift register with pseudo-random data.

10. The method of claim 9, wherein the initializing step comprises the step of: selecting a pseudo-random number sequence from a pseudo-random number sequence set including a plurality of pseudo-random sequences.

11. The method of claim 10, wherein the plurality of pseudo-random sequences are substantially uncorrelated.

12. The method of claim 9, wherein the initializing step comprises the step of: generating an other pseudo-random number sequence using at least one other linear feedback shift register; and transferring the other pseudo-random number sequence into the at least one linear feedback shift register.

13. The method of claim 9, wherein the step of acquiring N symbols of pseudo-random data comprises the steps of: generating a first pseudo-random number sequence using a first linear feedback shift register; generating a second pseudo-random number sequence using a second linear feedback shift register; logically combining the first and second random number sequences; and initializing a third linear feedback shift register using the logically combined first and second random number sequences, the third linear feedback shift register producing the acquired pseudo-random data.

14. An apparatus for reducing discrete power spectral density (PSD) components of wideband signals transmitting blocks of data, each block including N elements, the apparatus comprising: a shift register having cells configured to receive N symbols of pseudo-random data; a first linear feedback shift register configured to generate a first pseudo-random number sequence, a second linear feedback shift register configured to generate a second pseudo-random number sequence, a combiner coupled to the first and second linear feedback shift registers, the combiner configured to combine the first and second random number sequences, and a third linear feedback shift register coupled to the combiner and the shift register, the third linear feedback shift register configured to produce pseudo-random data for receipt by the shift register responsive to the combined first and second random number sequences; a register coupled to at least one of the first, second or third linear feedback shift registers, the register storing a set of pseudo-random number sequences; and an inverter coupled to select cells of the shift register, the inverter being configured to selectively invert a respective element in one of the data blocks responsive to bits in the select cells.

15. The apparatus of claim 14, wherein the respective element is selected from a group consisting of a bit, a symbol, and a frame.

16. The apparatus of claim 14, wherein the shift register includes designated symbol areas and wherein the inverter is coupled to one cell in each designated symbol area.

17. The apparatus of claim 16, wherein the inverter is coupled to a first cell in a first fixed position in a first designated symbol area and a second cell in a second fixed position in a second designated symbol area, wherein the first and second fixed positions are in different positions relative to the respective designated symbol areas.

18. The apparatus of claim 14, further comprising: a pseudo-random number generator coupled to the shift register, wherein the pseudo-random number generator is configured to supply pseudo-random data to initialize the shift register.

19. The apparatus of claim 14, wherein the pseudo-random number sequences within the set of pseudo-random number sequences are substantially uncorrelated.

20. The apparatus of claim 14, further comprising: a scrambler configured to scramble one or more elements within each block of data prior to selectively inverting by the inverter.

21. The apparatus of claim 20, further comprising: a scrambler register coupled to the scrambler, the scrambler register configured to store a set of pseudo-random number sequences and to supply the pseudo-random number sequences to the scrambler, wherein the pseudo-random number sequences within the set of pseudo-random number sequences are substantially uncorrelated.

22. An apparatus for transmitting blocks of data as ultra wideband (UWB) signals having reduced discrete power spectral density (PSD) components, each block including N elements, the apparatus comprising: a shift register having cells configured to receive N symbols of pseudo-random data; a feedback loop coupled between intermediate cells of the shift register and a first cell of the shift register, the feedback loon including a logic circuit that produces new bit values at the first cell responsive to bit values in the intermediate cells to replace one or more bits of the N symbols of pseudo-random data in the shift register for successive blocks of data; an inverter coupled to select cells of the shift register to receive one bit from each symbol of the pseudo-random data, the inverter being configured to selectively invert respective elements in one of the data blocks responsive to bits in the select cells; and a transmitter coupled to the inverter, the transmitter configured to transmit the selectively inverted respective elements.

23. The apparatus of claim 22, further comprising: a scrambler coupled to the inverter, the scrambler configured to scramble one or more elements within each block of data prior to selective inversion by the inverter.

24. A system for reducing discrete power spectral density (PSD) components of wideband signals transmitting blocks of data, each block including N elements, the system comprising: means for acquiring N symbols of pseudo-random data, each symbol having K bits, the means for acquiring N symbols comprising means for generating pseudo-random data, and means for shifting the generated pseudo-random data into a shift register, wherein the shift register includes N designated symbol areas; means for selecting one bit from a fixed position within each designated symbol area of the shift register to generate N selected bits; means for selectively inverting a respective element in one of the data blocks responsive to the selected bits; and means acquiring one or more bits of pseudo-random data to replace a corresponding one or more respective bits of the acquired N symbols of pseudo-random data, the means for acquiring one or more bits comprising means for generating the one or more bits of pseudo-random data, and means for shifting the generated one or more bits into the shift register to replace a corresponding number of bits of the acquired N symbols of pseudo-random data that are concurrently shifted out of the shift register.

25. The system of claim 24, further comprising: means for scrambling one or more elements within each block of data prior to the selectively inverting step.

* * * * *